US012143195B1

(12) United States Patent
Ismail et al.

(10) Patent No.: US 12,143,195 B1
(45) Date of Patent: Nov. 12, 2024

(54) ANGLE OF ARRIVAL (AoA) DETERMINATION FOR BLUETOOTH® LOW ENERGY (BLE)

(71) Applicant: Synopsys, Inc., Sunnyvale, CA (US)

(72) Inventors: Khaled Ismail, Cairo (EG); Khaled M. F. Elsayed, Giza (EG)

(73) Assignee: SYNOPSYS, INC., Sunnyvale, CA (US)

( * ) Notice: Subject to any disclaimer, the term of this patent is extended or adjusted under 35 U.S.C. 154(b) by 931 days.

(21) Appl. No.: 16/985,932

(22) Filed: Aug. 5, 2020

Related U.S. Application Data

(60) Provisional application No. 62/882,626, filed on Aug. 5, 2019.

(51) Int. Cl.
*H04B 7/08* (2006.01)
*G01S 5/06* (2006.01)
(Continued)

(52) U.S. Cl.
CPC ................ *H04B 7/086* (2013.01); *G01S 5/06* (2013.01); *H03H 11/20* (2013.01); *H04B 5/77* (2024.01); *H04B 7/165* (2013.01); *H04W 4/80* (2018.02)

(58) Field of Classification Search
CPC ...... H04B 7/086; H04B 5/0056; H04B 7/165; H04W 4/80; G01S 5/06; H03H 11/20
(Continued)

(56) References Cited

U.S. PATENT DOCUMENTS 5,325,402 A * 6/1994 Ushirokawa ...... H04L 25/03292 714/795
5,786,791 A * 7/1998 Bruckert ................... G01S 5/04 342/457

(Continued)

FOREIGN PATENT DOCUMENTS

EP 1641145 A1 * 3/2006 ............. H04B 7/086
EP 3361807 A1 * 8/2018 ............. H04B 7/086

(Continued)

OTHER PUBLICATIONS

Al-Sadoon, M.A.G. et al., "A New Low Complexity Angle of Arrival Algorithm for 1D and 2D Direction Estimation in MIMO Smart Antenna Systems," Sensors, 2017, vol. 17, 18 pages.

(Continued)

*Primary Examiner* — Nuzhat Pervin

(74) *Attorney, Agent, or Firm* — Lewis Roca Rothgerber Christie LLP

(57) ABSTRACT

A communication receiver can determine an angle of arrival (AoA) of a communication signal. The communication receiver includes multiple receiving antennas and processing circuitry. The processing circuitry determines multiple phase shifts over multiple instances in time from first samples of a communication signal as observed by a reference receiving antenna selected from among the multiple receiving antennas, samples the communication signal as observed by the selected receiving antennas from among the multiple receiving antennas over the multiple instances in time to provide second samples of the communication signal, removes the multiple phase shifts from corresponding samples from among the second samples of the communication signal to provide phase corrected second samples of the communication signal, and determines the (Continued)

AoA of the communication signal from the phase corrected second samples of the communication signal.

20 Claims, 5 Drawing Sheets

(51) Int. Cl.
*H03H 11/20* (2006.01)
*H04B 5/00* (2024.01)
*H04B 5/77* (2024.01)
*H04B 7/165* (2006.01)
*H04W 4/80* (2018.01)

(58) Field of Classification Search
USPC .......................................................... 342/148
See application file for complete search history.

(56) References Cited

U.S. PATENT DOCUMENTS 5,999,129 A * 12/1999 Rose .......................... G01S 5/12 342/442
6,061,022 A * 5/2000 Menegozzi ............... G01S 3/48 342/442
7,277,042 B1 * 10/2007 Cho .......................... G01S 7/00 342/25 R
7,982,671 B2 * 7/2011 Gonikberg ............. H04B 7/086 342/423
8,009,099 B2 * 8/2011 Kalliola .................... G01S 5/04 342/434
8,269,665 B1 * 9/2012 Urkowitz ............ G01S 13/4418 342/149
8,618,982 B2 * 12/2013 Pathmasuntharam . H04B 7/086 342/359
8,884,810 B2 * 11/2014 Perl ...................... H01Q 25/004 342/149
8,922,421 B2 * 12/2014 Pomietlasz ............. G01S 13/87 342/368
8,929,192 B2 * 1/2015 Kainulainen ............. G01S 3/48 342/417
8,965,211 B1 * 2/2015 Zanoni ................... H04B 10/61 398/208
8,965,284 B2 * 2/2015 Honkanen ............... H04W 4/80 455/41.1
9,618,600 B2 * 4/2017 Desai ........................ G01S 3/14
10,374,685 B2 * 8/2019 Xiao ....................... H04B 7/088
10,433,274 B2 * 10/2019 Jamieson ............... H04B 17/12
11,269,044 B2 * 3/2022 Stitt .......................... G01S 3/64
11,431,401 B2 * 8/2022 Ning ..................... H04W 24/02
2003/0011516 A1 * 1/2003 Moch ....................... H01Q 3/26 342/377
2004/0059547 A1 * 3/2004 Aftelak ................... H04L 1/208 702/190
2008/0012751 A1 * 1/2008 Owens ..................... G05D 1/12 342/25 R
2009/0231197 A1 * 9/2009 Richards .............. H01Q 3/2682 342/377
2010/0009644 A1 * 1/2010 Izumi ..................... H04B 7/086 455/132
2010/0123625 A1 * 5/2010 Martin ................... H01Q 1/246 342/377
2010/0259449 A1 * 10/2010 Abbasfar ............... H04B 7/086 342/442
2011/0074633 A1 * 3/2011 Pun ......................... G01S 3/043 342/442
2011/0133987 A1 * 6/2011 Bernsten ................ H04B 7/086 342/417
2012/0077516 A1 * 3/2012 Osinusi ..................... G01S 5/06 455/456.1
2012/0163510 A1 * 6/2012 Cho ....................... H04B 7/086 375/316
2013/0324061 A1 * 12/2013 Behdad ................ H01Q 3/2605 455/208
2014/0171116 A1 * 6/2014 LaMarca ........... H04M 1/72403 455/456.3
2015/0236756 A1 * 8/2015 Ballesteros ............. H04W 4/80 455/41.1
2015/0301154 A1 * 10/2015 Fehling .................. H04B 7/086 342/368
2016/0047885 A1 * 2/2016 Wang ........................ G01S 5/02 342/442
2016/0334498 A1 * 11/2016 Jamieson ............ G01S 5/02213
2016/0345286 A1 * 11/2016 Jamieson ............... H04B 17/12
2017/0212210 A1 * 7/2017 Chen ......................... G01S 5/06
2017/0227623 A1 * 8/2017 Park .......................... G01S 3/46
2018/0115439 A1 * 4/2018 Bhatti ................. H04L 25/0204
2018/0210075 A1 * 7/2018 Kim ...................... B64C 39/024
2018/0234159 A1 * 8/2018 Xiao ................... H04W 72/046
2018/0267131 A1 * 9/2018 Simileysky ........... H04W 4/026
2018/0278455 A1 * 9/2018 Reial ................... H04L 27/2278
2018/0352499 A1 * 12/2018 Khoury ................. H04W 48/08
2019/0120954 A1 * 4/2019 Kim ...................... G01S 13/582
2019/0166453 A1 * 5/2019 Edge ......................... G01S 5/06
2020/0057130 A1 * 2/2020 Simileysky ........... H04W 4/023
2020/0059755 A1 * 2/2020 Kabiri ..................... G01S 3/043
2020/0178054 A1 * 6/2020 Simileysky .......... H04B 17/336
2020/0264256 A1 * 8/2020 Stitt .......................... G01S 3/50
2020/0264257 A1 * 8/2020 Stitt .......................... G01S 3/50
2020/0386844 A1 * 12/2020 Park .......................... G01S 3/18
2021/0011109 A1 * 1/2021 Gibbons ................... G01S 5/12
2021/0405193 A1 * 12/2021 Yang ..................... G01S 7/4863
2022/0050162 A1 * 2/2022 Zand ..................... H04W 4/026

FOREIGN PATENT DOCUMENTS

EP 4096114 A1 * 11/2022 ............. H04B 7/088
WO WO-2015096099 A1 * 7/2015 ............. H04B 7/086
WO WO-2017082941 A1 * 5/2017 ............. H04B 7/086

OTHER PUBLICATIONS

Alrmah, Ma et al., "Angle of Arrival Estimation for Broadband Signals: A Comparison," IET Intelligent Signal Processing Conference, 2013, London, UK, 6 pages.
Badawy, A. et al., "A Simple Angle of Arrival Estimation Scheme," IEEE Wireless Communications and Networking Conference (WCNC), 2017, 7 pages.
Chen, H.C. et al., "Determining RF Angle of Arrival Using COTS Antenna Arrays: A Field Evaluation," IEEE Military Communications Conference, 2012, Orlando, Florida, 6 pages.
Cominelli, M. et al., "Dead on Arrival: An Empirical Study of The Bluetooth 5.1 Positioning System," WiNTECH'19, Oct. 24, 2019, Los Cabos, Mexico, 8 pages.
Gupta, P. et al., "MUSIC and Improved MUSIC algorithm to Estimate Direction of Arrival," IEEE ICCSP Conference, 2015, pp. 0757-0761.
Lehtimaki, S., "Understanding Advanced Bluetooth Angle Estimation Techniques for Real-Time Locationing," Embedded World 2018, Silicon Labs, 18 pages.
Lehtimaki, S., "Whitepaper: Bluetooth Angle Estimation for Real-Time Locationing," Silicon Labs, 6 pages.

* cited by examiner

ANGLE OF ARRIVAL (AoA) DETERMINATION FOR BLUETOOTH® LOW ENERGY (BLE)

CROSS-REFERENCE TO RELATED APPLICATIONS

The present application claims the benefit of U.S. Patent Appl. No. 62/882,626 filed on Aug. 5, 2019, which is incorporated herein by reference in its entirety.

TECHNICAL FIELD

The present disclosure relates to determining angle of arrivals (AoA) between a destination electronic device observing a communication signal and a source electronic device providing the communication signal, and including, compensating for erroneous phase shifts in samples of the communication signal resulting from timing differences between receiving antennas of the destination electronic devices.

BACKGROUND

The Bluetooth® Low Energy (BLE) communication standard outlines a low-power wireless personal area network technology for connecting various electronic devices to one another. The BLE communication standard is described in a version of a Bluetooth® communication standard, for example, Bluetooth® 4.x and/or Bluetooth® 5.x. This low-power wireless personal area network technology is useful for transferring small amount of data at lower speeds in home automation devices, fitness devices, medical devices, and/or personal health devices to provide some examples. The BLE communication standard describes low power, resource constrained electronic devices, referred to as peripheral devices and broadcaster devices, which communicate with much more powerful electronic devices, referred to as central devices and observer devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The market demand for Bluetooth® location services is increasing rapidly, with industry forecasts predicting over 400 million Bluetooth® location service electronic devices to be shipped by 2022. The introduction of Bluetooth® Low Energy (BLE) has allowed for the creation of powerful, low-cost real-time locating systems, indoor positioning systems, item finding systems, point of interest (PoI) information systems, and more. The ability of the BLE to locate electronic devices has led to the development of Bluetooth® proximity systems and Bluetooth® positioning systems. Bluetooth® positioning systems use BLE to determine physical location of electronic devices and involve more sophisticated infrastructure than Bluetooth® proximity systems. Real-time locating systems (RTLS) and indoor positioning systems (IPS) are two of the most popular types of Bluetooth® positioning systems.

The BLE standard outlines an optional direction-finding capability which can be used to determine the relative direction from a Bluetooth® destination device receiving a Bluetooth® signal to a Bluetooth® source device providing the Bluetooth® signal. The optional direction-finding capability feature utilizes an angle of arrival (AoA) to determine the relative direction of the Bluetooth® signal. The Bluetooth® source device transmits a special direction-finding signal using a single antenna which is observed by the Bluetooth® destination device over multiple receiving antennas. As to be described in further detail below, timing differences between the receiving antennas can introduce erroneous phase shifts into the samples of the special direction-finding signal which can degrade the accuracy of the AoA. The exemplary methods and apparatuses to be described in further detail below can determine the timing differences between the receiving antennas and thereafter compensate for the timing differences between the receiving antennas to thereby improve the accuracy of the AoA.

Exemplary Bluetooth® Low Energy (BLE) Communication Environment

Figure 1:
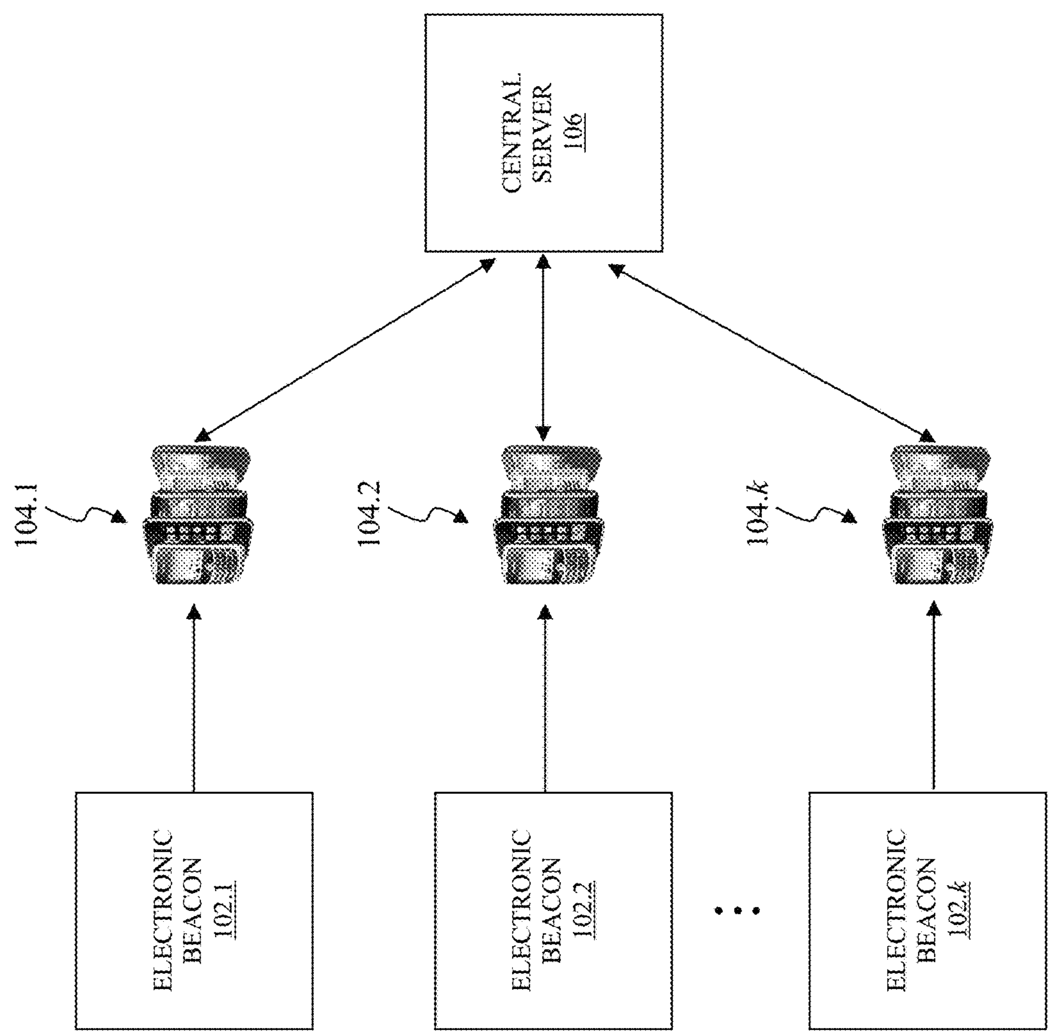
FIG. 1 illustrates a block diagram of an exemplary Bluetooth® Low Energy (BLE) communication environment according to exemplary embodiments of the present disclosure.

FIG. 1 illustrates a block diagram of an exemplary Bluetooth® Low Energy (BLE) communication environment according to exemplary embodiments of the present disclosure. Although the discussion to follow is to be described in terms of the BLE communication standard, those skilled in the relevant art(s) will recognize that the teachings herein are applicable to other communication standards which have the capability of providing constant tone signals, which are to be described in further detail below, without departing from the spirit and scope of the present disclosure. Generally, the BLE communication standard outlines a low-power wireless personal area network technology for connecting various electronic devices to one another. The BLE communication standard is described in a version of a Bluetooth® communication standard, for example, Bluetooth® 4.x and/or Bluetooth® 5.x (often referred to as BLE). This low-power wireless personal area network technology is useful for transferring small amount of data at lower speeds in home automation devices, fitness devices, medical devices, and/or personal health devices to provide some examples. The BLE communication standard describes low power, resource constrained electronic devices, referred to as peripheral devices and broadcaster devices, which communicate with much more powerful electronic devices, referred to as central devices and observer devices. Generally, the peripheral devices, such as health thermometers or heart rate sensors to provide some examples, represent connectable advertiser electronic devices which advertise their connectability allowing for bi-directional communication. Generally, the central devices, such as smartphones or computers to provide some examples, represent electronic devices which scan for advertisers and can initiate connections to provide the bi-directional communication. Generally, the broadcaster devices represent non-connectable advertiser electronic devices, such as a temperature sensor that broadcasts the current temperature or an electronic tag for asset tracking to provide some examples, which provide one-directional communication. Generally, the observer devices and the observer devices, such as a remote display to provide an example, represent electronic devices which scan for advertisers but cannot initiate connections to provide the one-directional communication.

In the exemplary embodiment illustrated in FIG. 1, an exemplary BLE communication environment 100 includes electronic beacons 102.1 through 102.*k*, one or more electronic devices 104.1 through 104.*k*, and a central server 106. In some embodiments, the exemplary BLE communication environment 100 can be implemented within one or more building and/or nonbuilding structures. Generally, the one or more building structures refer to any suitable structure or structures that are designed for human occupancy and can include one or more residential, industrial, and/or commercial building structures. The residential building structures can be characterized as being single-family detached homes or houses, single-family attached homes or houses, and/or large multi-family homes or houses. The commercial building structures can be characterized as being office building structures, non-freestanding retail building structures, also referred to as shopping malls, freestanding retail building structures, hotel building structures, and/or special purpose commercial building structures such as self-storage building structures, theme or amusement building structures, and/or theater building structures. The industrial building structures can be characterized as being manufacturing building structures, warehouse/distribution building structures, and/or flex space building structures, such as office buildings, laboratories, data centers, call centers and/or showrooms. The residential, industrial, and/or commercial building structures can further include specialty building structures, such as educational building structures, such as elementary schools, secondary schools, colleges, or universities; civic building structures, such as arenas, libraries, museums, or community halls; religious building structures, such as churches, mosques, shrines, temples, or synagogues; government building structures, such as city halls, courthouses, fire stations, police stations, or post offices; military building structures; and/or transport building structures, such as airport terminals, bus stations, or subway stations. Generally, the one or more non-building structures refer to any suitable structure or structures that are not designed for human occupancy and can include one or more residential, industrial, and/or commercial non-building structures. The one or more residential, industrial, and/or commercial non-building structures can include aqueducts, bridges and bridge-like structures, canals, communications towers, dams, monuments, roads, signage, and/or tunnels to provide some examples.

In the exemplary embodiment illustrated in FIG. 1, the electronic beacons 102.1 through 102.*k* can be implemented as connectable peripheral devices and/or non-connectable broadcaster devices. In some embodiments, these connectable peripheral devices can transmit data packets to the one or more electronic devices 104.1 through 104.*k* and can receive data packets from the one or more electronic devices 104.1 through 104.*k* whereas these non-connectable broadcaster devices can only transmit data packets to the one or more electronic devices 104.1 through 104.*k*. In these embodiments, the one or more electronic devices 104.1 through 104.*k* can connect and interact with one or more services implemented on these connectable peripheral devices. In some embodiments, the electronic beacons 102.1 through 102.*k* can communicate the data packets, referred to a broadcast event, to the one or more electronic devices 104.1 through 104.*k* at various broadcast intervals. The times between broadcast events can be referred to as advertising intervals, which are, for example, greater than 100 milliseconds (ms) for non-connectable broadcaster devices or greater than 20 ms for connectable peripheral devices.

As illustrated in FIG. 1, the one or more electronic devices 104.1 through 104.*k* can represent one or more mobile telephony devices, such as one or more mobile phones, one or more mobile computing devices, one or more mobile internet devices, such as one or more tablet computers and/or one or more laptop computers, one or more personal digital assistants, one or more handheld game consoles, one or more portable media players, one or more digital cameras, one or more pagers, one or more personal navigation devices, and/or any other suitable electronic device that is capable of wireless communication within the exemplary BLE communication environment 100. In the exemplary embodiment illustrated in FIG. 1, the one or more electronic devices 104.1 through 104.*k* can receive the data packets transmitted via the broadcast events of the one or more electronic beacons 102.1 through 102.*k*. In some embodiments, the one or more electronic devices 104.1 through 104.*k* can determine their distances from the one or more electronic beacons 102.1 through 102.*k*. In these embodiments, the one or more electronic beacons 102.1 through 102.*k* can determine the received signal strengths of the data packets received from the electronic beacons 102.1 through 102.*k* over the broadcast events and thereafter compare the received signal strengths of the data packets with the transmission signal strengths of the data packets to determine their distances from the one or more electronic beacons 102.1 through 102.*k*.

In some embodiments, the data packets can represent direction finding enabled data packets having known direction-finding signals which can be utilized by the one or more electronic devices 104.1 through 104.*k* to determine directions of the one or more electronic devices 104.1 through 104.*k* to the one or more electronic beacons 102.1 through 102.*k*. As to be described in further detail below, the one or more electronic devices 104.1 through 104.*k* can utilize these direction-finding signals to determine their directions to the one or more electronic beacons 102.1 through 102.*k*. In some embodiments, the one or more electronic devices 104.1 through 104.*k* can include multiple receiving antennas to sequentially sample these direction-finding signals. However, timing differences between the receiving antennas can introduce erroneous phase shifts into the samples of these direction-finding signals which can degrade the accuracy of their determined directions to the one or more electronic beacons 102.1 through 102.*k*. As to be described in further detail below, the one or more electronic devices 104.1 through 104.*k* can determine the timing differences between the receiving antennas and thereafter compensate for the timing differences between the receiving antennas to thereby improve the accuracy of their determined directions to the one or more electronic beacons 102.1 through 102.*k*.

Figure 2:
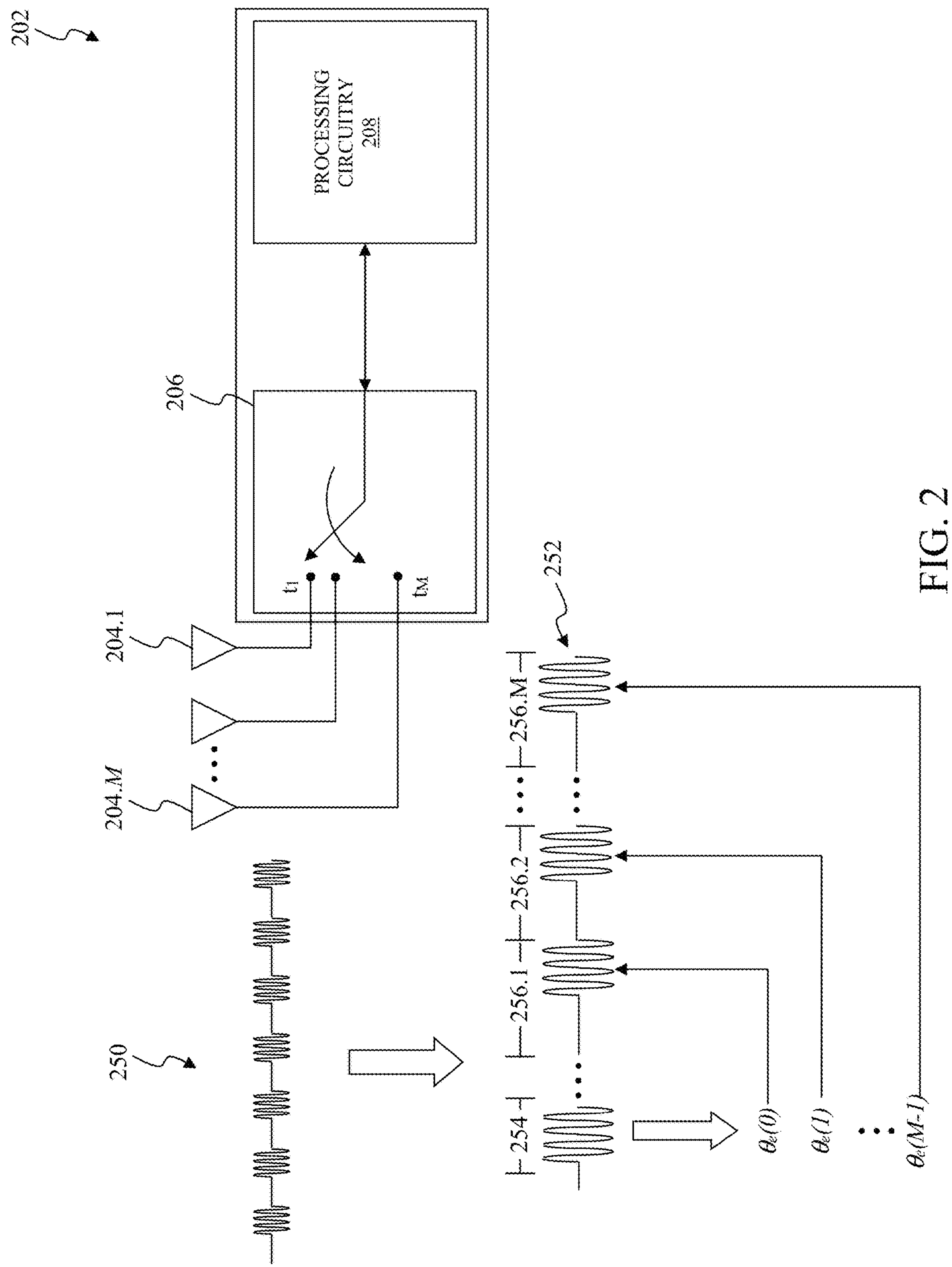
FIG. 2 illustrates a block diagram of an exemplary communication receiver within the exemplary Bluetooth® Low Energy (BLE) communication environment according to exemplary embodiments of the present disclosure.

Exemplary Communication Receiver within the Exemplary Bluetooth® Low Energy (BLE) Communication Environment FIG. 2 illustrates a block diagram of an exemplary communication receiver within the exemplary Bluetooth® Low Energy (BLE) communication environment according to exemplary embodiments of the present disclosure. In the exemplary embodiment illustrated in FIG. 2, a communication receiver 202 can sample a data packet 250 as observed by receiving antennas and can thereafter utilize specialized mathematical relationships between the samples of the data packet 250 to determine an angle of arrival (AoA), also referred to as direction of arrival (DoA), of the data packet 250. In some embodiments, the AoA represents an angular direction of the communication receiver 202 to a source electronic device providing the data packet 250, such as one or more of the electronic beacons 102.1 through 102.*k* as described above in FIG. 1. In some embodiments, timing differences between the receiving antennas can introduce erroneous phase shifts into the samples of the data packet 250 which can degrade the accuracy of the AoA. As to be described in further detail below, the communication receiver 202 can effectively compensate for these erroneous phase shifts to thereby improve the accuracy of the AoA. In some embodiments, the communication receiver 202 can be implemented as a standalone or a discrete device or may be incorporated within or coupled to another electrical device or host device, such as one or more of the one or more electronic devices 104.1 through 104.*k* as described above in FIG. 1. In these embodiments, these other electrical and/or host devices can include consumer electronics devices, cellular phones, smartphones, feature phones, tablet computers, wearable computer devices, personal digital assistants (PDAs), pagers, wireless handsets, laptop computers, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), networked or "smart" appliances, Machine-Type-Communication (MTC) devices, Machine-to-Machine (M2M) devices, and/or Internet of Things (IOT) devices to provide some examples.

As illustrated in FIG. 2, the communication receiver 202 includes receiving antennas 204.1 through 204.M, a switch fabric 206, and processing circuitry 208. In the exemplary embodiment illustrated in FIG. 2, the communication receiver 202 can observe the data packet 250 using the receiving antennas 204.1 through 204.M. In some embodiments, the data packet 250 can include a direction-finding signal 252, such as the known direction-finding signal as described above in FIG. 1. In these embodiments, the direction-finding signal 252 can represent a constant tone signal, for example, a series of logical one symbols, which can be transmitted using a constant tone during a reference period 254 and switching/sampling periods 256.1 through 256.M. As to be described in further detail below, the reference period 254 can be used by the communication receiver 202 to sample the direction-finding signal 252 using a reference receiving antenna from among the receiving antennas 204.1 through 204.M and the switching/sampling periods 256.1 through 256.M can be used by the communication receiver 202 to selectively sample the direction-finding signal 252 using the receiving antennas 204.1 through 204.M. As to be described in further detail below, the communication receiver 202 can utilize samples of the direction-finding signal 252 captured over the reference period 254 to determine erroneous phase shifts $\theta_e(0)$ through $\theta_e(M-1)$ within the samples of the direction-finding signal 252 captured over the switching/sampling periods 256.1 through 256.M. As to be described in further detail below, the communication receiver 202 can utilize the erroneous phase shifts $\theta_e$ (0) through $\theta_e(M-1)$ to compensate for these erroneous phase shifts $\theta_e(0)$ through $\theta_e(M-1)$ in samples of the direction-finding signal 252 captured over the switching/sampling periods 256.1 through 256.M.

In the exemplary embodiment illustrated in FIG. 2, the communication receiver 202 can sample the direction-finding signal 252 as observed by a reference receiving antenna from among the receiving antennas 204.1 through 204.M at instances in time $t_1$ through $t_M$, for example, once every two microseconds, over the reference period 254 to generate absolute samples of the reference period 254. The term "absolute" indicates that the samples of the reference period 254 include the erroneous phase shifts $\theta_e(0)$ through $\theta_e(M-1)$ resulting from the timing differences between the receiving antennas 204.1 through 204.M. In some embodiments, the communication receiver 202 can be referred to as an Adaptive Array System (AAS) having a network of electronic switches, also referred to as the switch fabric 206, coupled to the receiving antennas 204.1 through 204.M. In these embodiments, the processing circuitry 208 can control the switch fabric 206 to select the reference receiving antenna and can thereafter sample the direction-finding signal 252 over the reference period 254 at switching period times, for example, once every two microseconds, to generate the absolute samples of the reference period 254.

The processing circuitry 208 can thereafter perform a statistical analysis of the absolute samples of the reference period 254 to determine the erroneous phase shifts $\theta_e(0)$ through $\theta_e(M-1)$ at the instances in time $t_1$ through $t_M$ of the receiving antennas 204.1 through 204.M. In some embodiments, the erroneous phase shifts $\theta_e(0)$ through $\theta_e(M-1)$ can be mathematically expressed, in terms of phase, as:

$$\theta_e(t) = \text{angle}\left(\frac{1}{N-t}\sum_{n=1}^{N-t} x(n)x(n+t)^H\right), \tag{1}$$

where $\theta_e(t)$ represents an erroneous phase shift at a switching period time 1, N represents total number of the absolute samples of the reference period 254, x(n) represents the absolute samples of the reference period 254, and H represents the well-known Hermitian matrix operation.

In some embodiments, the erroneous phase shifts $\theta_e(0)$ through $\theta_e(M-1)$ can depend on time differences, also referred to as switching slot times, between the receiving antennas 204.1 through 204.M. For example, the switching slot times between the receiving antennas 204.1 through 204.M can be 0, 2, 4, 6, . . . microseconds for two (2) microsecond switching slots or 0, 4, 8, 12, . . . microseconds for a four (4) microsecond switching slots as outlined in the BLE communication standard. In some embodiments, for example, with Gaussian frequency-shift keying (GFSK) modulation with a modulation index of 0.5 as outlined in the BLE communication standard, each four (4) microsecond phase rotates by three hundred sixty (360) degrees for a one (1) Megabit per second transmission rate. In these embodiments, the erroneous phase shifts at 2 microseconds, 6 microseconds, 10 microseconds, etc. are equivalent and the erroneous phase shifts at 4 microseconds, 8 microseconds, 12 microseconds, etc. are equivalent. In these embodiments, the erroneous phase shifts $\theta_e(0)$ through $\theta_e(M-1)$ can be simplified by determining the erroneous phase shifts at 0 microseconds, at 2 microseconds, and at 4 microseconds. In some embodiments the erroneous phase shifts at 0 microseconds, at 2 microseconds, and at 4 microseconds can be mathematically expressed as:

$$\theta_e(0) = \text{angle}\left(\frac{1}{8}\sum_{n=1}^{8} x(n)x(n)^H\right) \tag{2}$$

$$\theta_e(2) = \text{angle}\left(\frac{1}{6}\sum_{n=1}^{6} x(n)x(n+2)^H\right) \tag{3}$$

$$\theta_e(4) = \text{angle}\left(\frac{1}{4}\sum_{n=1}^{4} x(n)x(n+4)^H\right) \tag{4}$$

where x(n) represents the absolute samples of the reference period 254.

Moreover, the communication receiver 202 can sample the direction-finding signal 252 over the switching/sampling periods 256.1 through 256.M as observed by the receiving antennas 204.1 through 204.M at the switching slot times, for example, once every two microseconds, to generate relative samples of the switching/sampling periods 256.1 through 256.M. The term "relative" indicates that the samples of the direction-finding signal 252 sampled over the switching/sampling periods 256.1 through 256.M include the erroneous phase shifts $\theta_e(0)$ through $\theta_e(M-1)$ resulting from the timing differences between the receiving antennas 204.1 through 204.M and phase differences resulting from spatial separations between the receiving antennas 204.1 through 204.M. As to be described in further detail below, the switching/sampling periods 256.1 through 256.M include a sequence of M switching periods to sequentially select among the receiving antennas 204.1 through 204.M interdigitated with M sampling periods to sample the direction-finding signal 252 as observed by the selected receiving antenna. In some embodiments, the duration of each of the M switching periods, also referred to as the switching slot times as described above, can be 0, 2, 4, 6, . . . microseconds for one (1) microsecond switching slots or 0, 4, 8, 12, . . . microseconds for a two (2) microsecond switching slots as outlined in the BLE communication standard. In the exemplary embodiment illustrated in FIG. 2, the processing circuitry 208 can control the switch fabric 206 to sequentially select from among the receiving antennas 204.1 through 204.M over the M switching periods and can sequentially sample the direction-finding signal 252 over the M sampling periods to provide the relative samples of the switching/sampling periods 256.1 through 256.M. In some embodiments, the relative samples of the switching/sampling periods 256.1 through 256.M can be expressed in a mathematical matrix X(t), such as, for example:

$$X(t)=[x_1(t_1)x_2(t_2)\ldots x_M(t_N)] \tag{5}$$

where $x_i(t_j)$ represents an $i^{th}$ sample from among the relative samples of the switching/sampling periods 256.1 through 256.M that was observed by a receiving antenna i from among the receiving antennas 204.1 through 204.M at an instance in time $t_i$ from among in time $t_1$ through $t_M$. In some embodiments, the communication receiver 202 can be alternatively, or additionally, develop a covariance matrix $R_{xx}$, also referred to as an auto-covariance matrix, from the relative samples of the switching/sampling periods 256.1 through 256.M. One such exemplary covariance matrix can be mathematically expressed as:

$$R_{xx}=E[X(t)X^H(t)], \tag{6}$$

where X(t) represents the mathematical matrix X(t) of the relative samples of the switching/sampling periods 256.1 through 256.M.

As described above, the timing differences between the receiving antennas 204.1 through 204.M can introduce the erroneous phase shifts $\theta_e(0)$ through $\theta_e(M-1)$ into the relative samples of the switching/sampling periods 256.1 through 256.M. In these embodiments, the covariance matrix $R_{xx}$ with these erroneous phase shifts can be mathematically expressed as:

$$R_{xx}=|R_{xx}|e^{j(\theta_{ant}(d)+\theta_e(t))}, \tag{7}$$

where $\theta_{ant}(d)$ represents the AoA of the data packet 250 which is a function of a separation distance d between the receiving antennas 204.1 through 204.M and $\theta_e$ (t) represents the erroneous phase shift at a time t from among the instances in time $t_1$ through $t_M$. In the exemplary embodiment illustrated in FIG. 2, the processing circuitry 208 compensates for the erroneous phase shifts $\theta_e(0)$ through $\theta_e(M-1)$ at the instances in time $t_1$ through $t_M$. In these embodiments, the processing circuitry 208 effectively removes the erroneous phase shifts $\theta_e(0)$ through $\theta_e(M-1)$, which were determined using the absolute samples of the reference period 254 as described above, from the relative samples of the switching/sampling periods 256.1 through 256.M. As illustrated in FIG. 2, the processing circuitry 208 removes a corresponding erroneous phase shift from among the erroneous phase shifts $\theta_e(0)$ through $\theta_e(M-1)$ from the absolute samples of the reference period 254 from a corresponding switching/sampling period from among the switching/sampling periods 256.1 through 256.M. For example, the processing circuitry 208 removes the erroneous phase shift $\theta_e(0)$ from the absolute samples of the reference period 254 from the switching/sampling period 256.1 In some embodiments, the erroneous phase shifts $\theta_e(0)$ through $\theta_e(M-1)$ can be removed from the covariance matrix $R_{xx}$ through conjugate multiplication as follows:

$$\hat{R}_{xx}=R_{xx}e^{-j\theta_e(t)}. \tag{8}$$

where $\hat{R}_{xx}$ represents a phase corrected covariance matrix $R_{xx}$ which has been compensated for the erroneous phase shift.

After compensating for the erroneous phase shifts $\theta_e(0)$ through $\theta_e(M-1)$, the processing circuitry 208 can determine the AoA of the data packet 250. In some embodiments, the processing circuitry 208 determines a spatial power spectrum of the data packet 250 from the covariance matrix $\hat{R}_{xx}$. The spatial power spectrum represents an indication of the power, for example, energy per unit of time, of the data packet 250 over multiple angles, for example, various angles between zero (0) and three hundred sixty (360) degrees. In some embodiments, the processing circuitry 208 can determine the spatial power spectrum of the data packet 250 using a well-known spatial power spectrum estimation algorithm, such as the Bartlett, Minimum Variance Distortionless Response (MVDR), and Multiple Signal Classification (MUSIC) to provide some examples. After calculating the spatial power spectrum, the processing circuitry 208 selects an angle from among the multiple angles having the greatest power, for example, energy per unit of time, from among the spatial power spectrum as the AoA of the data packet 250. In some embodiments, the processing circuitry 208 can combine the AoA of the data packet 250 with a well-known distance estimation technique to determine the location of the source electronic device transmitting the data packet 250.

Exemplary Method for Determining Angles of Arrival (AoAs)

Figure 3:
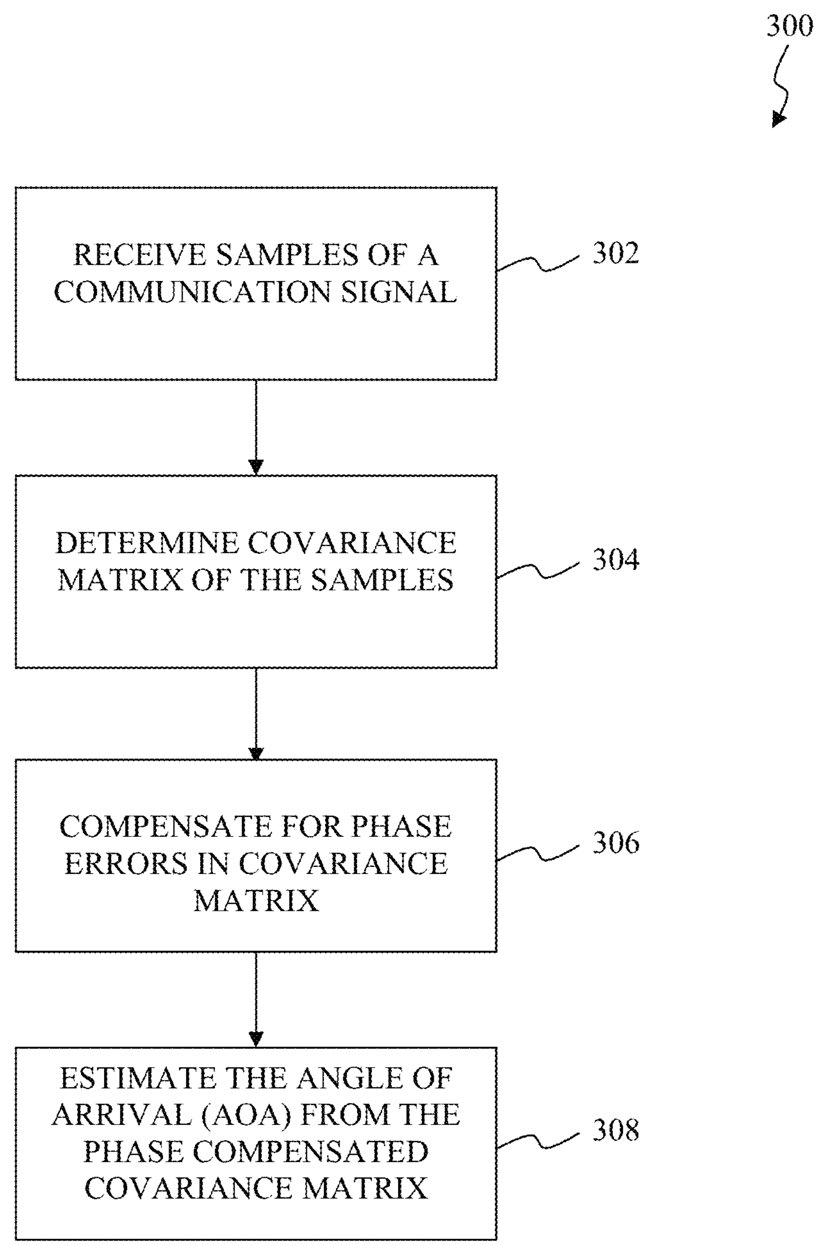
FIG. 3 illustrates a flowchart of exemplary operations for determining an angle of arrival (AoA) according to exemplary embodiments of the present disclosure.

FIG. 3 illustrates a flowchart of exemplary operations for determining an angle of arrival (AoA) according to exemplary embodiments of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 300 which determines erroneous phase shifts in samples of a communication signal and thereafter compensates for these erroneous phase shifts in the samples of the communication signal. In the exemplary embodiment illustrated in FIG. 3, the exemplary operational control flow 300 can be performed by a processor, such as the processing circuitry 208 of the communication receiver 202 as described above in FIG. 2.

At operation 302, the exemplary operational control flow 300 receives samples of a communication signal, such as the data packet 250 as described above in FIG. 2. In some embodiments, the exemplary operational control flow 300 can receive relative samples of the communication signal. In these embodiments, the relative samples of the communication signal represent samples of the communication signal that was observed by the receiving antennas, such as the receiving antennas 204.1 through 204.M as described above in FIG. 2. As described above, the term "relative" indicates that these samples of the communication signal include erroneous phase shifts resulting from the timing differences between the receiving antennas and phase differences resulting from spatial separations between the receiving antennas.

At operation 304, the exemplary operational control flow 300 determines a covariance matrix of the samples from operation 302 in a substantially similar manner as described above in FIG. 1 and FIG. 2. As described above in FIG. 1 and FIG. 2, one such exemplary covariance matrix can be mathematically expressed as:

$$R_{xx}=E[X(t)X^H(t)], \tag{9}$$

where X(t) represents the mathematical matrix X(t) of the relative samples of the communication signal from operation 302.

At operation 306, the exemplary operational control flow 300 compensates for erroneous phase shifts in the covariance matrix from operation 304. In some embodiments, the exemplary operational control flow 300 can receive the erroneous phase shifts at the instances in time $t_1$ through $t_M$, such as the erroneous phase shifts $\theta_e(0)$ through $\theta_e(M-1)$ as described above in FIG. 2. In these embodiments, the erroneous phase shifts can be mathematically expressed, in terms of phase, as:

$$\theta_e(t) = \text{angle}\left(\frac{1}{N-t}\sum_{n=1}^{N-t} x(n)x(n+t)^H\right) \tag{10}$$

where $\theta_e(t)$ represents an erroneous phase shift at a time t, N represents total number of absolute samples of the communication signal from operation 302, and x(n) represents the absolute samples of the communication signal from operation 302. As described above, the absolute samples of the communication signal from operation 302 represent samples of the communication signal that was observed by a reference receiving antenna from among the receiving antennas from operation 302. As described above, the term "absolute" indicates that these samples of the communication signal from operation 302 include erroneous phase shifts resulting from the timing differences between the receiving antennas. In some embodiments, the erroneous phase shifts at the instances in time $t_1$ through $t_M$ can be removed from the covariance matrix $R_{xx}$ through conjugate multiplication as follows:

$$\hat{R}_{xx}=R_{xx}e^{-j\theta_e(t)} \tag{11}$$

where $\hat{R}_{xx}$ represents the covariance matrix $R_{xx}$ which has been compensated for the erroneous phase shift.

At operation 308, the exemplary operational control flow 300 determines the AoA of the communication signal from operation 302 from the phase compensated covariance matrix $\hat{R}_{xx}$ from operation 306 in a substantially similar manner as described above in FIG. 1 and FIG. 2.

Exemplary Direction-Finding Enabled Data Packet

Figure 4:
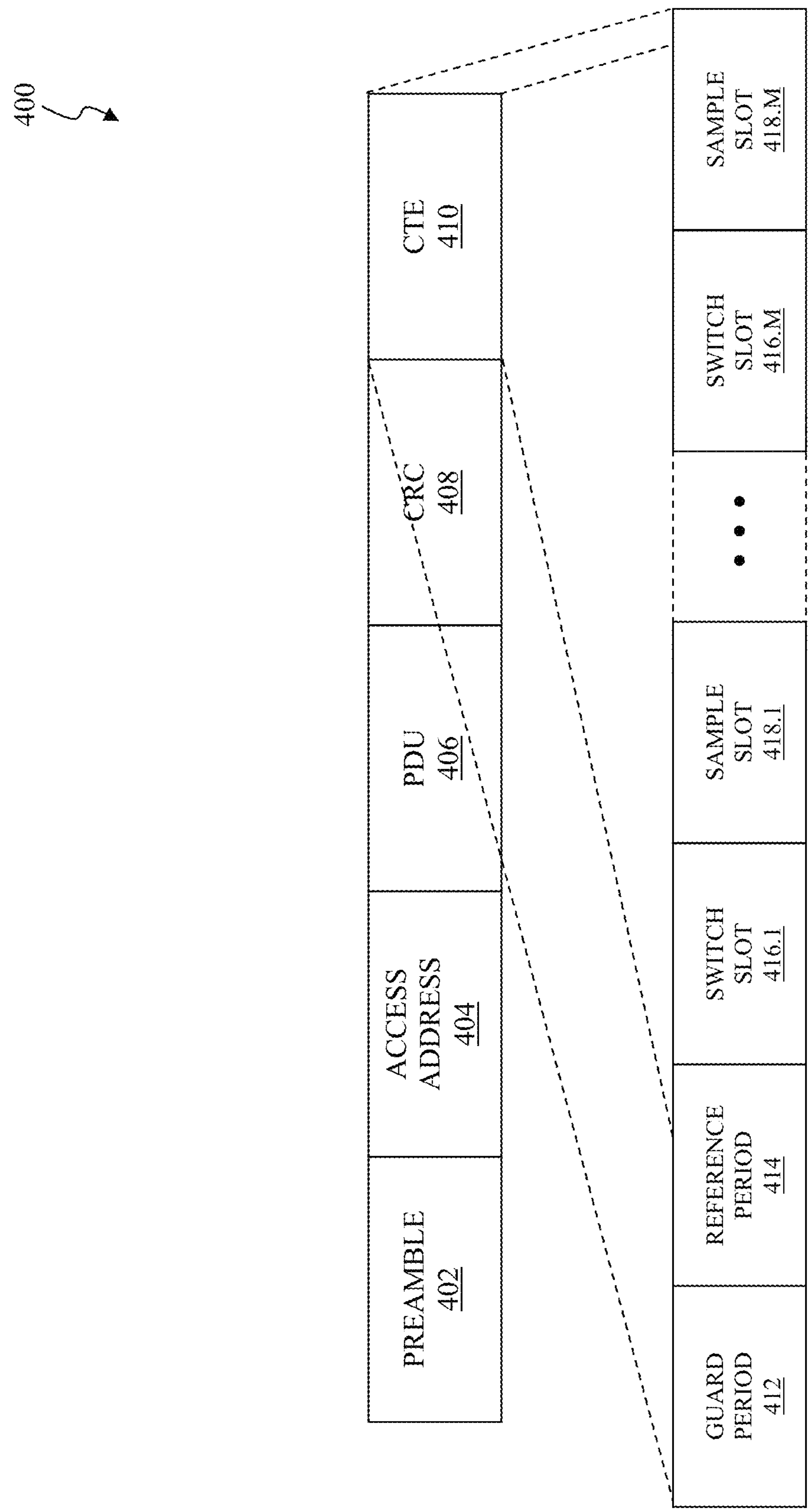
FIG. 4 graphically illustrates an exemplary direction-finding enabled data packet structure according to exemplary embodiments of the present disclosure.

FIG. 4 graphically illustrates an exemplary direction-finding enabled data packet structure according to exemplary embodiments of the present disclosure. As described above in FIG. 1 through FIG. 3, the BLE communication standard outlines specialized direction-finding enabled data packets having known direction-finding signals which can be utilized to determine direction from a destination electronic device observing these data packets, such as the one or more electronic devices 104.1 through 104.*k* as described above in FIG. 1 and/or the communication receiver 202 as described above in FIG. 2, to a source electronic device providing these data packets, such as the one or more electronic beacons 102.1 through 102.*k* as described above in FIG. 1. As illustrated in FIG. 4, an exemplary BLE direction finding packet structure 400 includes a preamble field 402, an access address field 404, a protocol data unit (PDU) field 406, a cyclic redundancy check (CRC) field 408, and a constant time extension (CTE) field 420. The preamble field 402, the access address field 404, the PDU field 406, and the CRC field 408 are all well-known conventional fields that are outlined in the BLE communication standard and will not be discussed in further detail in FIG. 4. As illustrated in FIG. 4, the constant time extension (CTE) field 420 can be utilized to determine the direction from the destination to the source as described above. As illustrated in FIG. 4, the CTE field 420 includes a guard period 412, a reference period 414, switching periods 416.1 through 416.M, and sample periods 418.1 through 418.M. The guard period 412 is a well-known conventional field that is defined in accordance with the BLE communication standard and will not be discussed in further detail in FIG. 4.

In the exemplary embodiment illustrated in FIG. 4, the reference period 414 represents a duration in time, for example, eight (8) microseconds, which can be utilized by the destination electronic device to sample a constant tone signal, such as the direction-finding signal 252 as described above in FIG. 2 to provide an example, using a reference receiving antenna from among receiving antennas of the destination electronic device, such as the receiving antennas 204.1 through 204.M as described above. In some embodiments, the constant tone signal can include a series of logical one symbols which can be transmitted using a constant tone. The reference period 414 can represent an exemplary embodiment of the reference period 254 as described above in FIG. 2. In some embodiments, the destination electronic device can acquire eight (8) absolute samples of the constant tone signal at one (1) microsecond intervals in time during the reference period 414. The term "absolute" indicates that these eight (8) absolute samples of the constant tone signal include the erroneous phase shifts resulting from the timing differences between the receiving antennas of the destination electronic device.

In the exemplary embodiment illustrated in FIG. 4, the switching periods 416.1 through 416.M, and the sample periods 418.1 through 418.M represents a duration in time, for example, one (1) microsecond or two (2) microseconds for each switching period from among the switching periods 416.1 through 416.M and one (1) microsecond or two (2) microseconds for each sample period from among the sample periods 418.1 through 418.M, which can be utilized by the destination electronic device to sample the constant tone signal, using the receiving antennas of the destination electronic device. In some embodiments, the switching periods 416.1 through 416.M are utilized by the destination electronic device to sequentially select from among the receiving antennas of the destination electronic device and the sample periods 418.1 through 418.M are utilized by the destination electronic device to sequentially sample the constant tone signal using the selected receiving antenna from among the receiving antennas of the destination electronic device. In some embodiments, the samples of the constant tone signal acquired during the switching periods 416.1 through 416.M represent relative samples of the constant tone signal. The term "relative" indicates that these samples of the constant tone signal include the erroneous phase shifts resulting from the timing differences between the receiving antennas of the destination electronic device and phase differences resulting from spatial separations between the receiving antennas of the destination electronic device.

Figure 5:
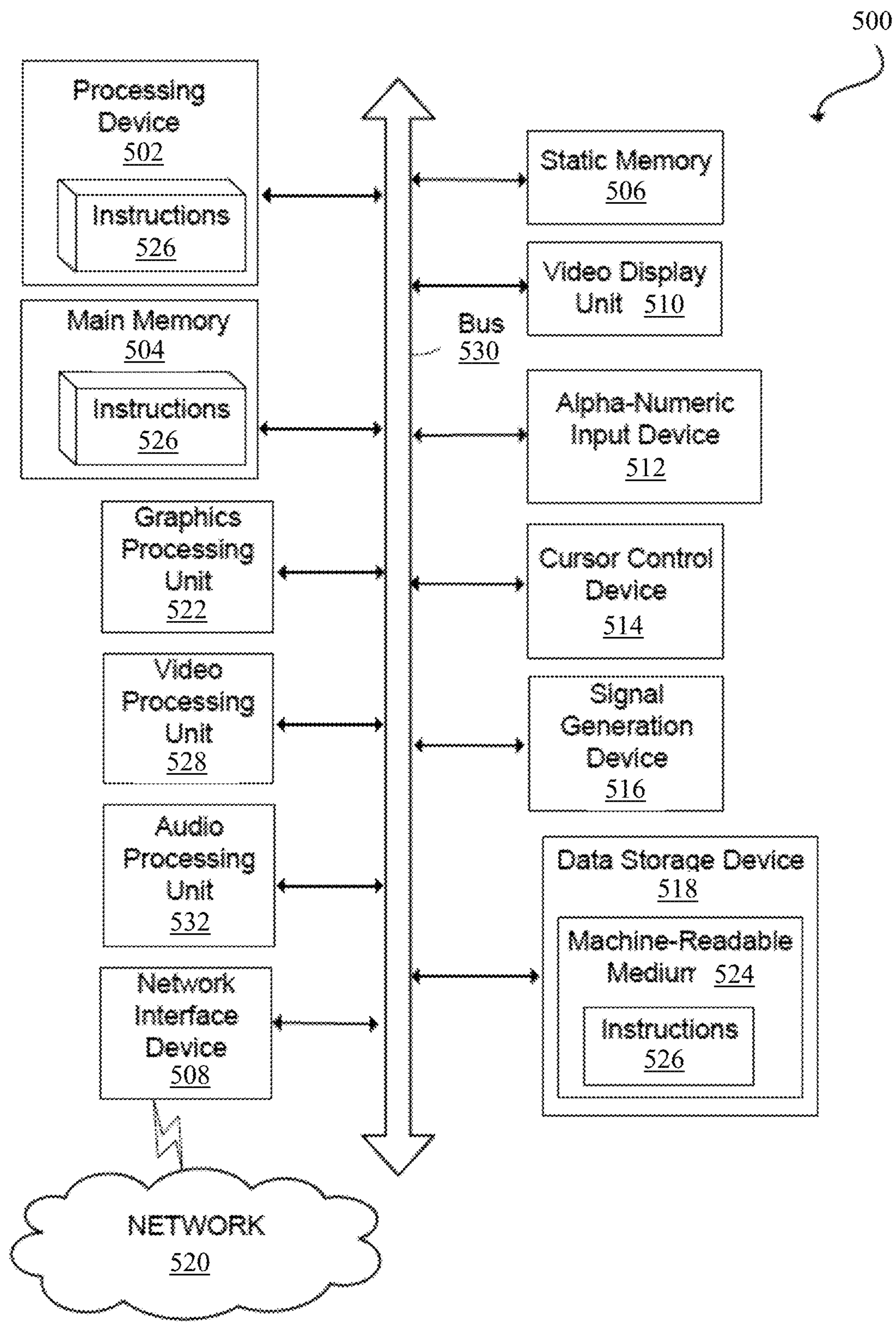
FIG. 5 illustrates a block diagram of an exemplary electronic processing system within the exemplary Bluetooth® Low Energy (BLE) communication environment according to exemplary embodiments of the present disclosure.

Exemplary Electronic Processing System within the Exemplary Bluetooth® Low Energy (BLE) Communication Environment FIG. 5 illustrates a block diagram of an exemplary electronic processing system within the exemplary Bluetooth® Low Energy (BLE) communication environment according to exemplary embodiments of the present disclosure. The discussion of FIG. 5 to follow is to describe an electronic processing system 500 which can be configured to receive samples of a constant tone signal, to determine a covariance matrix of the samples of the constant tone signal, and/or to compensate for erroneous phase shifts in the covariance matrix as described above in FIG. 1 through FIG. 4 or any combination thereof. In alternative implementations, the electronic processing system 500 may be connected (e.g., networked) to other processors or any combination thereof in a LAN, an intranet, an extranet, and/or the Internet. The electronic processing system 500 may operate in the capacity of a server or a client processor in client-server network environment, as a peer processor in a peer-to-peer (or distributed) network environment, or as a server or a client processor in a cloud computing infrastructure or environment.

In the exemplary embodiment illustrated in FIG. 5, the electronic processing system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 540.

The processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The electronic processing system 500 may further include a network interface device 508 to communicate over the network 540. The electronic processing system 500 also may include a video display unit 520 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 542.

The data storage device 518 may include a processor-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the electronic processing system 500, the main memory 504 and the processing device 502 also constituting processor-readable storage media.

In some implementations, the instructions 526 include instructions to implement functionality corresponding to the present disclosure. While the processor-readable storage medium 524 is shown in an example implementation to be a single medium, the term "processor-readable storage medium" should be taken to include a single medium or multiple media (e.g., a centralized or distributed database, and/or associated caches and servers) that store the one or more sets of instructions. The term "processor-readable storage medium" shall also be taken to include any medium that is capable of storing or encoding a set of instructions for execution by the processor and that cause the processor and the processing device 502 to perform any one or more of the methodologies of the present disclosure. The term "processor-readable storage medium" shall accordingly be taken to include, but not be limited to, solid-state memories, optical media, and magnetic media.

CONCLUSION

Some portions of the preceding detailed descriptions have been presented in relation to algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a processor, or similar electronic computing device, that manipulates and transforms data represented as physical (electronic) quantities within the processor's registers and memories into other data similarly represented as physical quantities within the processor memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a processor bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a processor-readable medium having stored thereon instructions, which may be used to program a processor (or other electronic devices) to perform a process according to the present disclosure. A processor-readable medium includes any mechanism for storing information in a form readable by a processor (e.g., a computer). For example, a processor-readable (e.g., computer-readable) medium includes a processor (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A communication receiver for determining an angle of arrival (AoA) of a communication signal, the communication receiver comprising:

a plurality of receiving antennas; and processing circuitry configured to:

determine a plurality of phase shifts over a plurality of instances in time from first samples of a constant tone signal captured during a reference period of a communication signal as observed by a reference receiving antenna selected from among the plurality of receiving antennas, the plurality of phase shifts corresponding to timing differences arising from sampling the plurality of receiving antennas at corresponding ones of the plurality of instances in time, sequentially sample the communication signal as observed by sequentially selected receiving antennas from among the plurality of receiving antennas over a plurality of sampling periods to provide second samples of the communication signal, remove the plurality of phase shifts from corresponding samples from among the second samples of the communication signal to provide phase corrected second samples of the communication signal, and determine the AoA of the communication signal from the phase corrected second samples of the communication signal.

2. The communication receiver of claim 1, wherein the processing circuitry is further configured to develop a covariance matrix from the second samples of the communication signal.

3. The communication receiver of claim 2, wherein the processing circuitry is configured to remove the plurality of phase shifts from the covariance matrix through conjugate multiplication to provide a phase-corrected covariance matrix having the phase corrected second samples of the communication signal.

4. The communication receiver of claim 3, wherein the processing circuitry is further configured to:

determine a spatial power spectrum of the communication signal over a plurality of angles from the phase-corrected covariance matrix, and select an angle from among plurality of angles having a greatest power to determine the AoA of the communication signal.

5. The communication receiver of claim 1, wherein the communication signal comprises a direction-finding enabled data packet as outlined by a version of a Bluetooth® Low Energy (BLE) communication standard.

6. The communication receiver of claim 5, wherein the direction-finding enabled data packet comprises the reference period and a plurality of switching periods interdigitated with the plurality of sampling periods, wherein the processing circuitry is configured to:

sequentially select each receiving antenna from among the plurality of receiving antennas during a corresponding switching period from among the plurality of switching periods, and sequentially sample the constant tone signal as observed by the selected receiving antenna during a corresponding sampling period from among the plurality of sampling periods to provide the second samples.

7. The communication receiver of claim 1, further comprising:

a switch fabric, coupled to the plurality of receiving antennas, configured to select one or more receiving antenna from among the plurality of receiving antennas.

8. The communication receiver of claim 1, wherein the processing circuitry is further configured to:

determine a received signal strength of the communication signal; and compare the received signal strength with a transmission signal strength of the communication signal to determine a distance from the communication receiver to a source electronic device providing the communication signal.

9. A method for compensating for phase errors within samples of a communication signal, the method comprising:

developing, by a processor, a covariance matrix having a first plurality of samples of a constant tone signal captured during a reference period of the communication signal that is observed by a plurality of receiving antennas;

receiving, by the processor, a plurality of phase shifts over a plurality of instances in time, the plurality of phase shifts being determined from a second plurality of samples of the communication signal that is observed by a reference receiving antenna from among the plurality of receiving antennas, each phase shift from among the plurality of phase shifts corresponding to timing differences arising from sequentially sampling a corresponding receiving antenna among the plurality of receiving antennas at a corresponding sampling period from among a plurality of sampling periods; and removing, by the processor, corresponding phase shifts from among the plurality of phase shifts from the first plurality of samples of the communication signal to provide a phase-corrected covariance matrix.

10. The method of claim 9, wherein the removing comprises:

performing a conjugate multiplication of the plurality of phase shifts and the covariance matrix to provide the phase-corrected covariance matrix.

11. The method of claim 9, wherein the communication signal comprises a direction-finding enabled data packet as outlined by a version of a Bluetooth® Low Energy (BLE) communication standard.

12. The method of claim 11, wherein the direction-finding enabled data packet comprises the reference period and a plurality of switching periods interdigitated with the plurality of sampling periods, and wherein the plurality of phase shifts is determined from the second plurality of samples of the direction-finding enabled data packet that is observed by the reference receiving antenna during the reference period.

13. The method of claim 12, further comprising:

sequentially selecting each receiving antenna from among the plurality of receiving antennas during a corresponding switching period from among the plurality of switching periods; and sequentially sampling the constant tone signal of the communication signal as observed by the selected receiving antenna during a corresponding sampling period from among the plurality of sampling periods to provide the second plurality of samples of the direction-finding enabled data packet.

14. An electronic processing system for determining an angle of arrival (AoA) of a communication signal, the electronic processing system comprising:

a memory that stores instructions; and a processor configured to execute the instructions, the instructions, when executed by the processor configuring the processor to:

determine a plurality of phase shifts over a plurality of instances in time from first samples of a constant tone signal captured during a reference period of a communication signal as observed by a reference receiving antenna selected from among a plurality of receiving antennas, the plurality of phase shifts corresponding to timing differences arising from sampling the plurality of receiving antennas at corresponding ones of the plurality of instances in time, sample the communication signal as observed by sequentially selected receiving antennas from among the plurality of receiving antennas over a plurality of sampling periods to provide second samples of the communication signal, remove the plurality of phase shifts from corresponding samples from among the second samples of the communication signal to provide phase corrected second samples of the communication signal, and determine the AoA of the communication signal from the phase corrected second samples of the communication signal.

15. The electronic processing system of claim 14, wherein the instructions, when executed by the processor, further configure the processor to develop a covariance matrix from the second samples of the communication signal.

16. The electronic processing system of claim 15, wherein the instructions, when executed by the processor, configure the processor to remove the plurality of phase shifts from the covariance matrix through conjugate multiplication to provide a phase-corrected covariance matrix having the phase corrected second samples of the communication signal.

17. The electronic processing system of claim 16, wherein the instructions, when executed by the processor, further configure the processor to:

determine a spatial power spectrum of the communication signal over a plurality of angles from the phase-corrected covariance matrix, and select an angle from among plurality of angles having a greatest power to determine the AoA of the communication signal.

18. The electronic processing system of claim 14, wherein the communication signal comprises a direction-finding enabled data packet as outlined by a version of Bluetooth® Low Energy (BLE) communication standard.

19. The electronic processing system of claim 18, wherein the direction-finding enabled data packet comprises the reference period and a plurality of switching periods interdigitated with the plurality of sampling periods, wherein the instructions, when executed by the processor, further configure the processor to:

sequentially select each receiving antenna from among the plurality of receiving antennas during a corresponding switching period from among the plurality of switching periods, and sequentially sample the constant tone signal as observed by the selected receiving antenna during a corresponding sampling period from among the plurality of sampling periods to provide the second samples.

20. The electronic processing system of claim 14, wherein the instructions, when executed by the processor, further configure the processor to cause a switch fabric, coupled to the plurality of receiving antennas, to select one or more receiving antenna from among the plurality of receiving antennas.

* * * * *